United States Patent [19]
Dai et al.

[11] Patent Number: 5,691,215
[45] Date of Patent: Nov. 25, 1997

[54] METHOD FOR FABRICATING A SUB-HALF MICRON MOSFET DEVICE WITH INSULATOR FILLED SHALLOW TRENCHES PLANARIZED VIA USE OF NEGATIVE PHOTORESIST AND DE-FOCUS EXPOSURE

[75] Inventors: Chang-Ming Dai; Hong-Chang Dai; Shih-Chang Tai, all of Hsinchu, Taiwan

[73] Assignee: Industrial Technology Research Institute, Hsinchu, Taiwan

[21] Appl. No.: 703,084

[22] Filed: Aug. 26, 1996

[51] Int. Cl.⁶ .................................................. H01L 21/762
[52] U.S. Cl. ............................ 437/44; 437/67; 437/229
[58] Field of Search ........................ 437/44, 67, 229, 437/235, 238; 148/DIG. 50

[56] References Cited

U.S. PATENT DOCUMENTS

| | | | |
|---|---|---|---|
| 4,506,434 | 3/1985 | Ogawo et al. | 437/67 |
| 4,836,885 | 6/1989 | Breiten et al. | 437/67 |
| 4,916,087 | 4/1990 | Tateoka et al. | 437/229 |
| 5,077,234 | 12/1991 | Scoopo et al. | 437/67 |
| 5,175,122 | 12/1992 | Wang et al. | 437/67 |

*Primary Examiner*—Chandra Chaudhari
*Attorney, Agent, or Firm*—George O. Saile; Stephen B. Ackerman

[57] ABSTRACT

A process for globally planarizing the insulator used to fill narrow and wide shallow trenches, used in a MOSFET device, structure, has been developed. The process features smoothing the topography that exists after the insulator filling of narrow and shallow trenches, by creating photoresist plugs, only in the depressed topography regions. This is accomplished using a negative photoresist layer, a de-focus exposure, and the identical mask used to create the shallow trench pattern in a positive photoresist layer. A RIE procedure, with a 1:1 etch selectivity, is used to complete the planarization process.

20 Claims, 3 Drawing Sheets

METHOD FOR FABRICATING A SUB-HALF MICRON MOSFET DEVICE WITH INSULATOR FILLED SHALLOW TRENCHES PLANARIZED VIA USE OF NEGATIVE PHOTORESIST AND DE-FOCUS EXPOSURE

BACKGROUND OF THE INVENTION (1) Field of the Invention

This invention relates to a method of fabricating semiconductor devices, and more specifically to a method for global planarization of the insulator material used to fill shallow trenches in semiconductor devices.

(2) Description of the Prior Art

The objectives of the semiconductor industry, increasing device performance while reducing the cost of semiconductor devices, have been successfully addressed by the ability to create devices with sub-micron features, or micro-miniaturization. Several semiconductor fabrication disciplines, such as photolithography and dry etching, have allowed micro-miniaturization to be realized. For example the use of more sophisticated exposure cameras, as well as the use of more sensitive photoresist materials have allowed sub-micron images to be created in photoresist layers. In addition the development of more advanced dry etching tools and etch chemistries, have allowed these sub-micron images in photoresist layers to be successfully transferred to underlying materials, used for the fabrication of sub-micron semiconductor devices. However as advanced semiconductor devices, such as metal oxide semiconductor field effect transistors, (MOSFET), become smaller, specific regions of these devices have to be addressed.

Field oxide regions, (FOX), used to isolate specific regions of the MOSFET device, are usually created via thermal oxidation of a silicon region. The non-isolation regions, or regions to be used for the active device region, are protected from the thermal oxidation process via the use of a composite oxidation resistant mask, usually comprised of an overlying layer of silicon nitride and an underlying layer of silicon dioxide. However during the creation of the FOX region, via thermal oxidation, field oxide encroachment, or birds beak formation, occurs under the composite oxidation resistant mask, resulting in a loss of active device area. To compensate for birds beak formation, device designers have enlarged the active device region, to accommodate this phenomena, but ultimately resulting in a larger semiconductor chip, adversely influencing the performance and cost objectives. In addition the creation of a FOX region results in a non-planar topography, due to the growth of approximately half the thickness of the FOX region above the initial surface of the starting semiconductor substrate. Therefore the semiconductor industry has turned to shallow trench isolation, as a replacement for FOX isolation, for sub-micron MOSFET devices.

Shallow trench isolation, consisting of etching trenches in silicon, filling the trenches with an insulator material, and planarization of the insulator material, is now extensively being used for sub-micron MOSFET fabrication. However device designs demand various shallow trench widths, and various active device region widths, or the width of the spaces between shallow trenches. Therefore since the filling of narrow width trenches demands less insulator material, (due to the convergence of the depositing layers on all sides of the narrow trench), then wider trenches, topography differences will occur in the form of thicker insulator material accumulating over the narrow shallow trenches and spaces between, while a less accumulated insulator material, only sufficient enough to fill the wider trenches, will overlie the wider shallow trenches and spaces. These topography differences can result in difficulties when attempting to planarize the insulator material, using either chemical mechanical polishing, (CMP), or reactive ion etching, (RIE) procedures. Global planarization is difficult to achieve via CMP or RIE procedures due to endpoint sensitivities. This invention will describe a RIE planarization process, using a novel negative photoresist procedure, used to fill just the lower topography, wider trenches with photoresist, filling in the areas in which the accumulation of insulator material was at a minimum. The negative photoresist plug results in a smoother topography between narrow and wider trenches, for subsequent planarization processing. The filling of the wider trenches with negative photoresist is accomplished using the identical mask, previously used with positive resist to create the shallow trench feature, and also using a de-focus exposure, allowing only images greater then about 2 microns to be exposed. This results in negative resist only appearing in the wider trenches and wider spaces, where it was needed to planarize the topography. Prior art, such as Scopoo, in U.S. Pat. No. 5,077,234, describes using a photoresist plug to fill wide trenches, however that prior art does not use negative photoresist plugs and integrate the critical de-focus procedure in the fabrication process.

SUMMARY OF THE INVENTION

It is an object of this invention to fabricate sub-half micron MOSFET devices using insulator filled shallow trenches.

It is another object of this invention to fabricate narrow width, shallow trenches, with narrow spaces between the narrow width shallow trenches, as well as fabricating wide, shallow trenches, with wide spaces between trenches.

It is still another object of this invention to completely fill all shallow trenches, with a chemically vapor deposited insulator layer.

It is yet another object of this invention to plug only the wide shallow trench regions with photoresist plugs, via use of a negative photoresist, using the shallow trench mask with de-focus exposure, only allowing wide features to be exposed.

It is still yet another object of this invention to planarize the MOSFET device structure via selective RIE procedures, using the negative photoresist plug to protect the wide shallow trench regions during the etch back procedure.

In accordance with the present invention a method for fabricating a sub-half micron MOSFET device, using planarized, insulator filled shallow trenches, is described. Shallow trench patterns are etched in a semiconductor substrate, with the shallow trench pattern comprised of narrow width trenches, separated by narrow spaces, with the spaces to be used for subsequent sub-half micron MOSFET devices, as well as wider shallow trenches, used for isolation purposes. A thick layer of insulator is deposited completely filling all trenches, resulting in a higher insulator topography in areas of narrow trenches, and narrow spaces, and lower insulator topography in areas of wide, shallow trenches. A negative photoresist layer is applied, and exposed using the identical mask, previously used with positive photoresist for the shallow trench definition, and using de-focus conditions that will not result in exposure of the negative photoresist in the region overlying the narrow shallow trench and spaces. Removal of the unexposed negative photoresist results in negative photoresist plugs, only in the lower insulator topography, encountered in the wide shallow trench regions.

Another layer of photoresist is then applied, and baked, to insure a smooth topography across the semiconductor substrate. A blanket RIE procedure, without etch selectivity between photoresist and the insulator layer, is used remove both photoresist layers, while also removing the thicker insulator layer in the higher insulator topographies, creating a smooth topography comprised of insulator filled, narrow and wide shallow trenches, and the spaces between them. A MOSFET device is next fabricated in the narrow spaces between the narrow shallow trenches via a growth of a gate insulator layer, deposition of a polysilicon layer, patterning to from a polysilicon gate structure, and source and drain processing.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Figure 1:
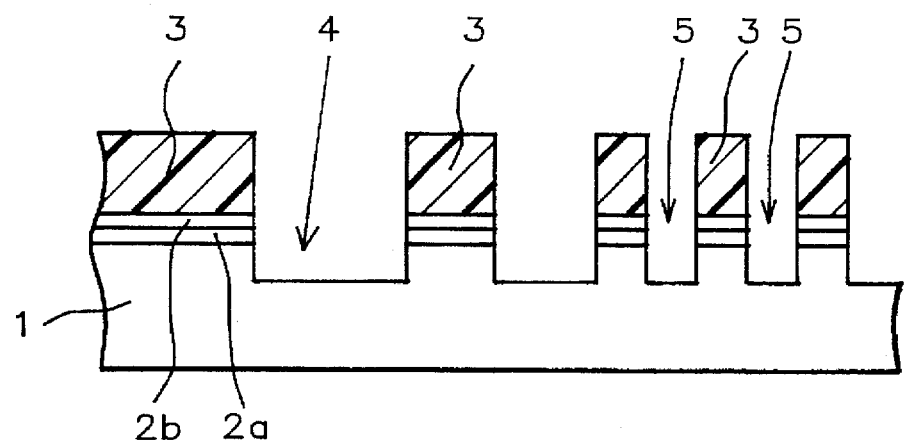
FIGS. 1–5, which schematically, in cross-sectional style, show the fabrication stages used to achieve a planar topography for a semiconductor substrate comprised of narrow and wide, insulator filled shallow trenches, and narrow and wide spaces between the insulator filled shallow trenches.

The method of fabricating a sub-half micron MOSFET device structure using insulator filled, shallow trench isolation, will now be described. A P type, single crystalline substrate, 1, having a <100> crystallographic orientation, is used, and schematically shown in FIG. 1. A thin pad silicon oxide layer, 2a, is formed via thermal oxidation procedures, to a thickness between about 50 to 300 Angstroms, followed by the deposition of a silicon nitride layer, 2b, obtained via the use of either low pressure chemical vapor deposition, (LPCVD), or plasma enhanced chemical vapor deposition, (LPCVD), procedures, at a temperature between about 550° to 720° C., to a thickness between about 1000 to 2000 Angstroms. A positive photoresist layer, 3, is next applied, and exposed using a shallow trench pattern mask. After development and removal of the exposed positive photoresist regions, a reactive ion etching, (RIE) procedure, is used to transfer the image in the positive photoresist layer, 3, to the underlying semiconductor substrate, 1. The RIE procedure, using $CF_4$—$CHF_3$—Ar as an etchant for silicon nitride layer, 2b and silicon oxide layer, 2a, and using HBr—$Cl_2$—$O_2$ as an etchant for semiconductor substrate, 1, creates wide shallow trenches, 4, between about 5 to 100 uM in width, and narrow shallow trenches, 5, between about 0.18 1.0 uM in width. The spaces between the narrow shallow trenches, 5, to be subsequently used for a sub-half micron MOSFET device, is between about 0.18 to 1.0 uM in width. The depth of the trenches is between about 4000 to 6000 Angstroms. This stage of the process is schematically shown in FIG. 1.

Figure 2:
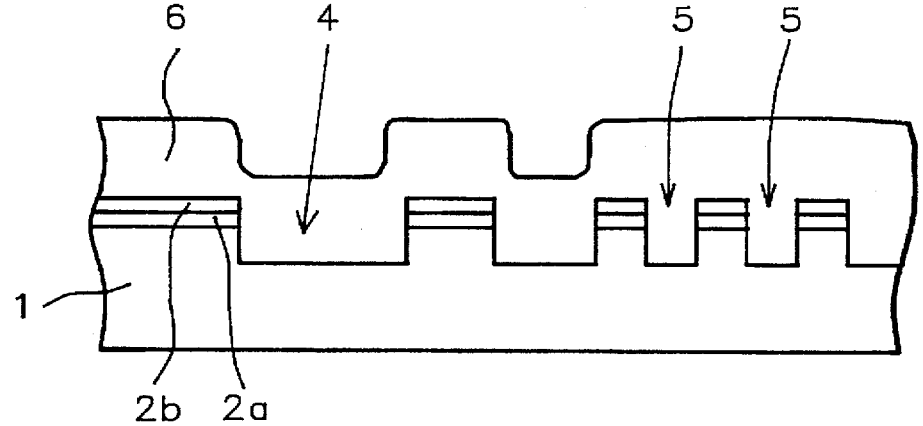

After removal of positive photoresist layer, 3, via plasma oxygen ashing, and careful wet cleans, a layer of silicon oxide, 6, is used to fill all shallow trenches. Silicon oxide layer, 6, is obtained via LPCVD procedures, at a temperature between about 550° to 750° C., to a thickness between about 5000 to 7000 Angstroms, using tetraethylorthosilicate, (TEOS), as a source. FIG. 2, shows the result of this TEOS deposition. The narrow shallow trenches, 5, fill by silicon oxide layer, 6, coating the sides, as well as the bottom, of the narrow shallow trenches, 5. The convergence of the depositing silicon oxide layers on the narrow shallow trench sidewalls, completely fill the narrow shallow trenches, prior to filling the wider shallow trenches, 4, which can only fill by the depositing silicon oxide accumulating on the bottom of the trench. Thus to completely fill the wider shallow trenches, 4, regions of narrow shallow trenches, 5, and the spaces between them are overfilled. This results in a difference in topography between the narrow shallow trench, and spaces between, and the wider shallow trenches, of between about 5000 to 7000 Angstroms. This shown schematically in FIG. 2.

Figure 3:
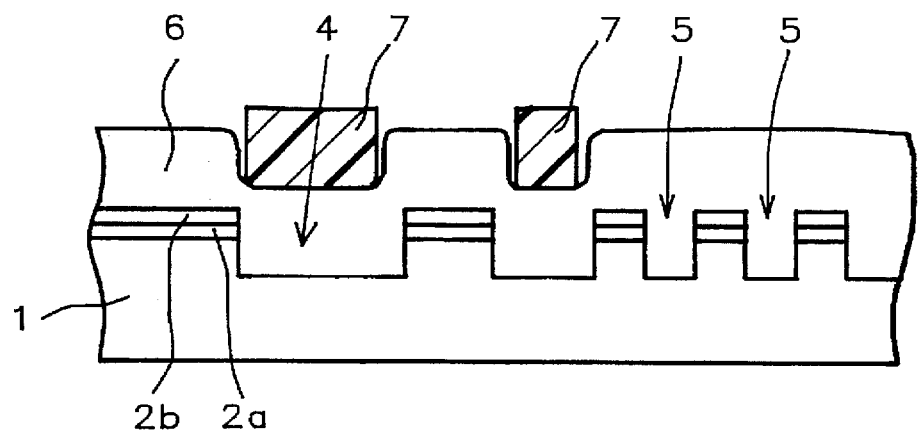
Figure 4:
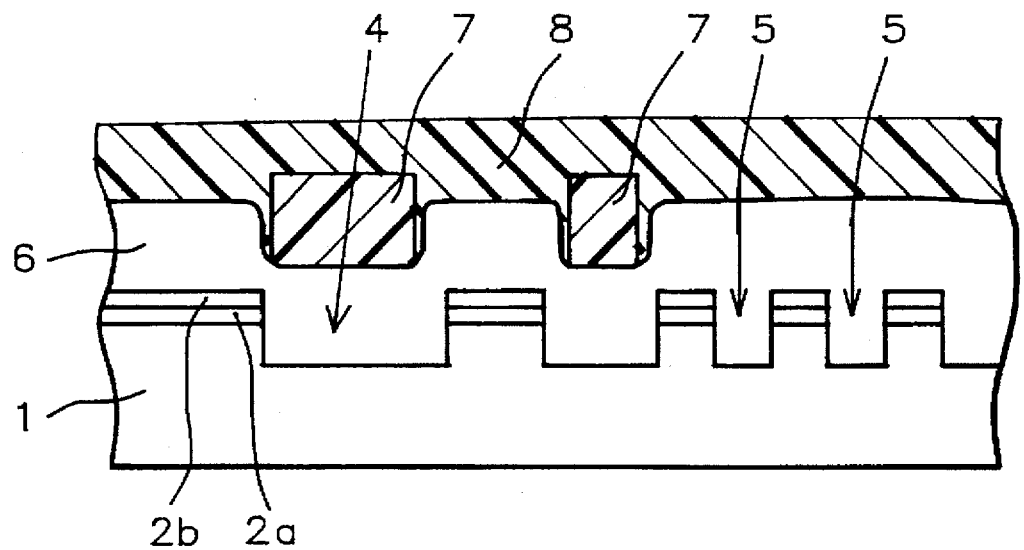

The difference between the higher insulator topography, in narrow shallow trench regions, and the lower insulator topography, in wide shallow trench regions, can present difficulties when attempting to planarize. To enable a smooth topography, across all width shallow trenches, a unique, global planarization process has been developed. A negative photoresist layer, 7, is applied and exposed using the identical mask previously used to define the shallow trench pattern, in positive photoresist layer, 3. The exposure is performed on the negative photoresist with de-focus conditions of an exposure dosage of between about 15 to 25 millijoules/$cm^2$, and about 2.0 uM of defocus, insuring exposure will not occur in negative photoresist layer, 7, when the openings in the mask are less then between about 0.18 to 1.0 uM. Therefore the negative photoresist layer, 7, will not be exposed in regions where the narrow shallow trenches, and spaces between the narrow shallow trenches, exist. Subsequent photoresist development removes only unexposed regions of negative photoresist layer, 7, therefore resulting in negative photoresist plugs, 7, formed only in the lower insulator topography, wider shallow trench regions. The formation of the negative photoresist plugs, 7, partially levels the topography, prior to insulator planarization. This is schematically shown in FIG. 3. To completely smooth the topography, another positive photoresist layer, 8, is applied, and baked at a temperature between about 200° to 250° C., resulting in a smooth photoresist topography across semiconductor substrate, 1, prior to initiating the insulator planarization procedure. This is schematically shown in FIG. 4.

Figure 5:
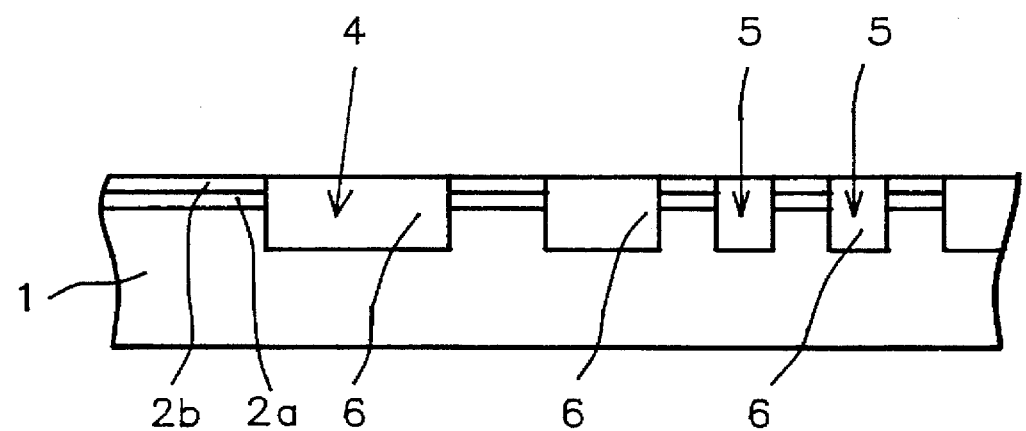

The insulator planarization procedure begins with a RIE etch back step, using $CHF_3$—$CF_4$—Ar as an etchant, with a 1:1 etch selectivity between photoresist and silicon oxide, but with a selectivity of about 5 between silicon oxide and silicon nitride, which is used as a RIE etch stop material. With the 1:1 selectivity between photoresist and silicon oxide, the RIE etch back procedure allows the transfer of the smooth photoresist topography, shown in FIG. 4, to a smooth silicon oxide-silicon nitride topography, shown schematically in FIG. 5. The RIE planarization procedure terminates with the appearance of silicon nitride layer, 2b, in non-trench regions, resulting in planarized insulator filled narrow and wide, shallow trenches, equal in topography to the adjacent spaces between the insulator filled trenches. A wet etch dip, using a buffered HF solution, is followed by removal of silicon nitride layer, 2b, via use of RIE procedures, using $CHF_3$—$CF_4$—Ar as an etchant. The underlying pad oxide, 2a, is then removed again using a buffered HF solution.

Figure 6:
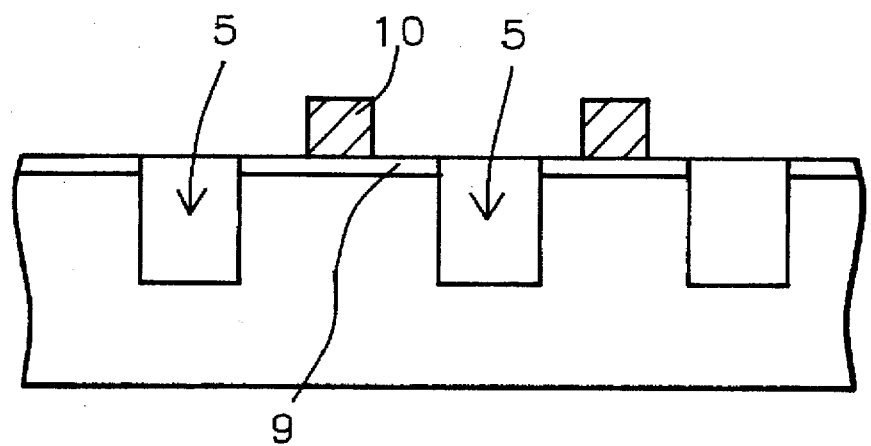
FIGS. 6–7, which schematically, in cross-sectional style, show the fabrication of a sub-half micron MOSFET device structure, in the narrow space between insulator filled, narrow shallow trenches.
Figure 7:
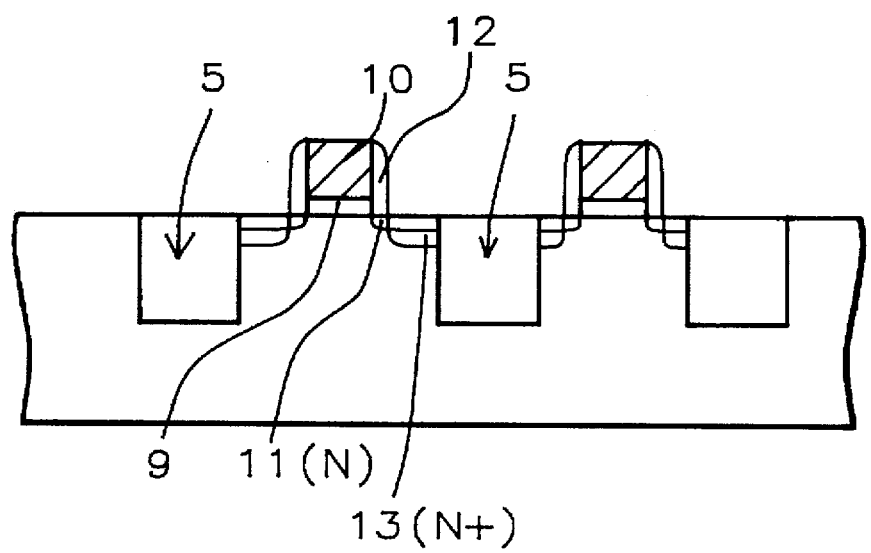

FIGS. 6–7, schematically show the stages of fabrication used to create a sub-half micron MOSFET device, in the spaces between narrow shallow trenches, 5. The space between narrow, shallow trenches, 5, is between about 0.18 to 1.0 uM. First a silicon dioxide layer, 9, used for the gate insulator layer, is thermally grown in an oxygen-steam ambient, at a temperature between about 850° to 950° C., to a thickness between about 50 to 250 Angstroms. Next a polysilicon layer is deposited using LPCVD procedures at a temperature between about 500° to 800° C., to a thickness between about 1000 to 4000 Angstroms. The polysilicon can be grown using insitu doping procedures by incorporation of either arsine or phosphine to a silane ambient, or grown intrinsically and doped via ion implantation of either arsenic or phosphorous, at an energy between about 25 to 75 KeV, at a dose between about 5E14 to 1E16 atoms/cm$^2$. Patterning of the polysilicon layer is accomplished via photolithographic and dry etching procedures, using HBr—Cl$_2$ as an etchant, to create polysilicon gate structure, 10, schematically shown in FIG. 6, after photoresist removal. The width of polysilicon gate structure, 10, for the sub-micron MOSFET device, is between about 0.18 to 1.0 uM. A lightly doped source and drain region, 11, is created via ion implantation of phosphorous, at an energy between about 25 to 100 KeV, at a dose between about 1E12 to 1E14 atoms/cm$^2$. A layer of silicon oxide is next deposited, using LPCVD or PECVD procedures, at a temperature between about 550° to 750° C., to a thickness between about 1000 to 3000 Angstroms. Anisotropic RIE procedures are employed, using CHF$_3$—CF$_4$—Ar, as an etchant, to create insulator sidewall spacer, 12, schematically shown in FIG. 7. Finally a heavily doped source and drain region, 13, is formed, via ion implantation of arsenic, at an energy between about 50 to 150 KeV, at a dose between about 1E14 to 5E15 atoms/cm$^2$. The resulting sub-half micron MOSFET device, shown schematically in FIG. 7, in the narrow space between narrow shallow trenches, 5, has a channel length between about 0.18 to 1.0 uM.

This process for fabricating a sub-half micron MOSFET device, using insulator filled shallow trenches planarized via use of negative photoresist and de-focus exposure, although shown applied to N channel MOSFET devices, can also be applied to P channel MOSFET devices. This invention can also be used for CMOS, (complimentary), or BiCMOS devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with silicon oxide filled shallow trenches, comprising the steps of:

growing a first silicon oxide layer on said semiconductor substrate;

depositing a silicon nitride layer on said first silicon oxide layer;

applying a first positive photoresist layer on said silicon nitride layer;

developing narrow and wide features in said first positive photoresist layer using a first exposure mask;

anisotropic dry etching, using said narrow and said wide features, in said first photoresist layer as a mask, to create said narrow and wide features in said silicon nitride layer, in said first silicon oxide layer, and continuing said anisotropic dry etching to create narrow and wide shallow trenches in said semiconductor substrate;

removal of said first positive photoresist layer;

depositing a second silicon oxide layer, completely filling said narrow shallow trenches, and completely filling said wide shallow trenches, and creating an uneven topography, comprised of a thick layer of said second silicon oxide, overlying silicon oxide filled, narrow shallow trenches, and overlying spaces between said silicon oxide filled, narrow shallow trenches, and of a thin layer of said second silicon oxide, overlying said silicon oxide wide shallow trenches;

application of a negative photoresist layer on said second silicon oxide layer;

developing wide negative photoresist plugs, using said first exposure mask, in areas directly overlying said wide shallow trenches;

applying a second positive photoresist layer on said negative photoresist plugs, and on said thick second silicon oxide layer, overlying said silicon oxide filled, narrow shallow trenches, and the spaces between said silicon oxide filled, narrow shallow trenches;

baking of said second positive photoresist layer to create a level surface topography;

planarizing via dry etching to remove said second positive photoresist layer and said negative photoresist plugs, exposing top surface of said silicon oxide filled, wide shallow trenches, and dry etching removal of said second positive photoresist layer, and said thick second silicon oxide layer, exposing the top surface of said silicon oxide filled, narrow shallow trenches, and exposing the top surface of said silicon nitride layer, in areas between said silicon oxide filled, narrow shallow trenches;

removal of said silicon nitride layer;

removal of said first silicon oxide layer;

growing a third silicon oxide layer, to be used as the gate insulator layer;

depositing a polysilicon layer;

patterning of said polysilicon layer to create a polysilicon gate structure, on said gate insulator layer, in the space between said silicon oxide filled, narrow shallow trenches;

ion implanting a first conductivity imparting dopant into said semiconductor substrate, in the space between said silicon oxide filled, narrow shallow trenches, and not covered by said polysilicon gate structure, to create lightly doped source and drain region;

depositing a fourth silicon oxide layer;

anisotropic dry etching of said fourth silicon oxide layer, to create an insulator spacer on the sides of said polysilicon gate structure; and ion implanting a second conductivity imparting dopant into said semiconductor substrate, in the space between said silicon oxide filled, narrow shallow trenches, and not covered by said polysilicon gate structure, and not covered by said insulator spacer, to create heavily doped source and drain regions.

2. The method of claim 1, wherein said narrow shallow trench is created via RIE procedures, using HBr—Cl$_2$—O$_2$ as an etchant, to a depth between about 4000 to 6000 Angstroms, with a width between about 0.18 to 100 uM, with the spaces between said narrow shallow trench, to be used for said MOSFET device, being between about 0.18 to 100 uM in width.

3. The method of claim 1, wherein said wide shallow trench is created via RIE procedures, using HBr—Cl$_2$—O$_2$ as an etchant, to a depth between about 4000 to 6000 Angstroms, and with a width between about 5 to 100 uM.

4. The method of claim 1, wherein said second silicon oxide layer, used to fill said narrow and wide shallow trenches, is obtained via LPCVD procedures, at a temperature between about 550° to 750° C., to a thickness between about 5000 to 7000 Angstroms, using tetraethylorthosilicate as a source.

5. The method of claim 1, wherein the topography difference in height between said thick silicon oxide layer, on the top surface of the spaces between said narrow shallow trenches, and said thin silicon oxide layer, in said wide shallow trench, is between about 5000 to 7000 Angstroms.

6. The method of claim 1, wherein said negative photoresist plugs are formed using de-focus exposure conditions that result in only the formation of said negative photoresist plugs greater then about 1.0 uM in width.

7. The method of claim 1, wherein said second positive photoresist layer is baked at a temperature between about 200° to 250° C.

8. The method of claim 1, wherein the RIE planarization of said second silicon oxide layer, used to fill said narrow shallow trenches and said wide shallow trenches, is performed using $CHF_3$—$CF_4$—Ar as an etchant, with a silicon oxide to photoresist etch selectivity of about 1:1.

9. The method of claim 1, wherein the width of the polysilicon gate structure is between about 0.18 to 1.0 uM.

10. The method of claim 1, wherein the channel length of said MOSFET device, fabricated in the space between said narrow shallow trenches, is between about 0.18 to 1.0 uM.

11. A method of fabricating a sub-half micron MOSFET device, on a semiconductor substrate, using silicon oxide filled narrow and wide shallow trenches, with planarization of said silicon oxide filled narrow and wide shallow trenches, accomplished via dry etching procedures, applied to a topography consisting of negative photoresist plugs, used for filling the low regions on said semiconductor substrate, prior to said planarization, comprising the steps of:

growing a first silicon oxide layer, to be used as a pad oxide layer, on said semiconductor substrate;

depositing a silicon nitride layer on said pad oxide layer;

applying a first positive photoresist layer on said silicon nitride layer;

developing narrow and wide features in said first positive photoresist layer, using a shallow trench exposure mask;

anisotropic dry etching of said silicon nitride layer, of said pad oxide layer, and of said semiconductor substrate, using said narrow and wide features in said first positive photoresist layer, to create narrow and wide shallow trenches in said semiconductor substrate;

removal of said first positive photoresist layer;

depositing a second silicon oxide layer, completely filling said narrow shallow trenches, and completely filling said wide shallow trenches, creating an uneven topography comprised of a thick layer of said second silicon oxide, overlying said silicon oxide filled narrow shallow trenches, and the spaces between said silicon oxide filled narrow shallow trenches, and of a thin layer of said second silicon oxide layer, overlying said silicon oxide filled wide shallow trenches;

applying a negative photoresist layer on said second silicon oxide layer;

developing wide negative photoresist plugs, using said shallow trench exposure mask, in areas overlying said wide shallow trenches;

applying a second positive photoresist layer on said wide negative photoresist plugs, and on said thick second silicon oxide layer, overlying said silicon oxide filled, narrow shallow trenches and the spaces between said silicon oxide filled, narrow shallow trenches;

baking of said second positive photoresist layer to create a level topography;

planarizing via dry etching removal of said second positive photoresist layer, and of said wide negative photoresist plugs, exposing top surface of said silicon oxide filled, wide shallow trenches, and dry etching removal of said second positive photoresist layer, and of said thick second silicon oxide layer, exposing top surface of said silicon oxide filled, narrow shallow trenches, and the top surface of said silicon nitride layer, in spaces between said silicon oxide filled, narrow shallow trenches;

removal of said silicon nitride layer;

removal of said pad oxide layer;

growing a third silicon oxide layer, to be used for the gate insulator layer;

depositing a polysilicon layer;

patterning of said polysilicon layer to create a sub-half micron wide, polysilicon gate structure, in the space between said silicon oxide filled, narrow shallow trenches;

ion implanting a first conductivity imparting dopant into said semiconductor substrate, in the space between said silicon oxide filled, narrow shallow trenches, and not covered by said sub-half micron wide, polysilicon gate structure, to create a lightly doped source and drain region;

depositing a fourth silicon oxide layer;

anisotropic dry etching of said fourth silicon oxide layer, to create an insulator spacer on the sides of said sub-half micron wide, polysilicon gate structure; and ion implanting a second conductivity imparting dopant into said semiconductor substrate, in the space between said silicon oxide filled, narrow shallow trenches, and not covered by said sub-half micron wide, polysilicon gate structure, and not covered by said insulator spacer, to create said heavily doped source and drain region.

12. The method of claim 11, wherein said narrow shallow trench is created via RIE procedures, using HBr—$Cl_2$—$O_2$ as an etchant, to a depth between about 4000 to 6000 Angstroms, with a width between about 0.18 to 100 uM, and with spaces between said narrow shallow trench, to be used for said sub-half micron MOSFET device, being between about 0.18 to 100 uM in width.

13. The method of claim 11, wherein said wide shallow trench is created via RIE procedures, using HBr—$Cl_2$—$O_2$ as an etchant, to a depth between about 4000 to 6000 Angstroms, with a width between about 5 to 100 uM.

14. The method of claim 11, wherein said second silicon oxide layer, used to fill said narrow shallow trenches, and said wide shallow trenches, is obtained via LPCVD procedures, at a temperature between about 550° to 750° C., to a thickness between about 5000 to 7000 Angstroms, using tetraethylorthosilicate as a source.

15. The method of claim 11, wherein the topography difference in height between said thick silicon oxide layer, on the top surface of the space between said narrow shallow trenches, and said thin silicon oxide layer, in said wide shallow trenches, is between about 5000 to 7000 Angstroms.

16. The method of claim 11, wherein said negative photoresist plugs are formed using de-focus exposure conditions that will only allow said negative photoresist plugs, greater then about 1.0 uM, to be formed.

17. The method of claim 11, wherein said second positive photoresist layer is baked at a temperature between about 200° to 250° C.

18. The method of claim 11, wherein RIE planarization of said second silicon oxide layer, used to fill said narrow shallow trenches and said wide shallow trenches, is performed using $CHF_3$—$CF_4$—Ar as an etchant, with a silicon oxide to photoresist etch selectivity of about about 1:1.

19. The method of claim 11, wherein the width of said sub-half micron, polysilicon gate structure, is between about 0.18 to 1.0 uM.

20. The method of claim 11, wherein the channel length of said sub-half micron MOSFET device, fabricated in the space between said narrow shallow trenches, is between about 0.18 to 1.0 uM.

* * * * *